(12) United States Patent
Renovell et al.

(10) Patent No.: US 6,642,870 B1
(45) Date of Patent: Nov. 4, 2003

(54) METHOD AND DEVICE FOR INTEGRATED TESTING FOR AN ANALOG-TO-DIGITAL CONVERTER

(75) Inventors: Michel Renovell, Montferrier/Lez (FR); Florence Azais, Gombaillaux (FR); Serge Bernard, Lamaster (FR); Yves Bertrand, Montpellier (FR)

(73) Assignee: Centre National de la Recherche Scientifique (C.N.R.S.), Paris (FR)

( * ) Notice: Subject to any disclaimer, the term of this patent is extended or adjusted under 35 U.S.C. 154(b) by 0 days.

(21) Appl. No.: 10/070,828

(22) PCT Filed: Sep. 7, 2000

(86) PCT No.: PCT/FR00/02474
§ 371 (c)(1),
(2), (4) Date: Jun. 2, 2002

(87) PCT Pub. No.: WO01/18969
PCT Pub. Date: Mar. 15, 2001

(51) Int. Cl.[7] .................................................. H03M 1/10
(52) U.S. Cl. ........................................ 341/120; 341/118
(58) Field of Search ................................. 341/120, 118, 341/121, 155, 163

(56) References Cited

U.S. PATENT DOCUMENTS 5,793,642 A * 8/1998 Frisch et al. ................. 364/490
5,854,598 A * 12/1998 De Vries et al. ............. 341/120

FOREIGN PATENT DOCUMENTS

FR          0 336 715 A3      10/1989

OTHER PUBLICATIONS

XP–000409779, Custom Integrated Circuits Conference, MOK et al, "Strech: Self Testing Reliability Evaluation Chip", 1993, pp. 30.4.1–30.4.4.

XP–0004007233, Microelectronics Jounral 27, "Embedded ADC Characterization Techniques Using a Bist Structure, An ADC Model and Histogram Data ", 1996, pp. 539–549.

* cited by examiner

*Primary Examiner*—Brian Young
*Assistant Examiner*—Joseph Lauture
(74) *Attorney, Agent, or Firm*—Young & Thompson

(57) ABSTRACT

A device for self-testing of an analog-to-digital converter includes elements for applying to the converter test signals and analyzing elements. The analyzing elements include common resources (10,36) integrated in the circuit bearing the converter and capable of being configured to determine successively shift, gain and non-linearities of the converter and elements for configuring and controlling the common resources (10,36) so as to adapt them to the characteristics to be determined.

15 Claims, 10 Drawing Sheets

METHOD AND DEVICE FOR INTEGRATED TESTING FOR AN ANALOG-TO-DIGITAL CONVERTER

BACKGROUND OF THE INVENTION

The present invention concerns analog to digital converters and relates more particularly to the integration of a self-test module which makes it possible to measure the functional characteristics of the converter, such as shift, gain, non-linearities and others, using the histogram test principle.

DESCRIPTION OF THE PRIOR ART

With regard to the testing of analog to digital converters, manufacturers mainly use two methods, namely the histogram test and the Fast Fourier Transform (FFT) test.

The use of these methods requires very expensive high-performance external test equipment in the form of an industrial tester.

A conventional solution for reducing the cost of this external test consists of integrating test modules inside the circuit itself.

It is accepted that this type of solution is economically viable in so far as the surface area of the added modules represents only 10% to 15% of the original surface area of the circuit.

The integration of a histogram test device in its conventional form poses a problem since the surface area of the added test modules is excessive having regard to the extremely high volume of data to be stored on the one hand and the complex operations to be performed to allow use on the other hand.

SUMMARY OF THE INVENTION

The invention aims to remedy this drawback by redefining the histogram test technique so as to have only a small number of items of information to be stored on the integrated circuit and to evaluate the characteristics of the converter using simple operations.

It also aims to produce an integrated test module occupying a small surface area so as to make the histogram test solution economically advantageous.

According to one aspect of the present invention, there is provided a method of testing an analog to digital converter by histogram, consisting of decomposing in time, accumulation and use of the histogram, wherein the method of testing uses common resources for successively processing functional characteristics of the analog to digital converter and wherein the method of testing further consists of successively initializing and configuring said resources to adapt them to the determination of each of the functional characteristics of said converter.

According to another aspect of the present invention, there is provided a self-test device for an analog to digital converter for implementing a method of testing the analog to digital converter by histogram, consisting of decomposing in time, accumulation and use of the histogram, wherein the method of testing uses common resources for successively processing the functional characteristics of the analog to digital converter and wherein the method of testing further consists of successively initializing and configuring said resources to adapt them to the determination of each of the functional characteristics of said converter; the self-test device comprising: means of applying test signals to the converter, and analysis means, wherein:

said analysis means include integrated and configurable common resources for successively determining the functional characteristics of the converter and means of configuring said common resources with a view to adapting them to the characteristics to be determined.

The device may have a reference code counter/comparator connected to the output of the analog to digital converter, a use and storage counter/downcounter whose output delivers signals relating to the functional characteristics of the converter and a controller for managing the test phases by means of the counter/comparator and the counter/downcounter.

BRIEF DESCRIPTION OF THE DRAWINGS

For a better understanding of the invention and to show how the same may be carried into effect, reference will now be made, by way of example, to the accompanying drawings, in which.

DESCRIPTION OF THE PREFERRED EMBODIMENTS

The invention relates to the integrated testing of analog to digital converters.

In a conventional manner, according to such a solution, it is a case of integrating, on the same silicon as the ADC, a module for applying test stimuli to the input of the converter and a module for observing and analyzing the responses output from the converter.

Figure 1:
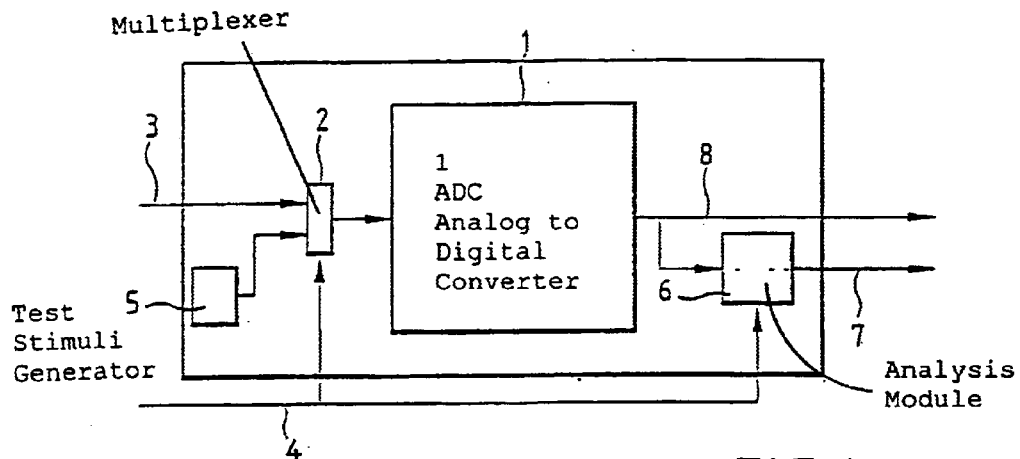
FIG. 1 is a block diagram of an analog to digital converter with a test circuit incorporated in its integrated circuit.

Such an arrangement is shown in FIG. 1, which depicts an analog to digital converter ADC 1, to the input of which there is connected a multiplexer 2 having an input connected to the analog input 3 of the circuit, an input connected to a line 4 applying a test signal and an input connected to the output of a test stimuli generator 5.

At its output, the ADC 1 is connected to an analysis module 6 which has an input, by means of which it is connected to the test signal application line 4 and a test output 7, whilst the ADC has an independent digital output 8.

Since solutions developed for the generation of stimuli already exist, the invention relates more specifically to the analysis module with a view to promoting the possibility of integrating the histogram test technique into the ADC.

The histogram test is based on a statistical analysis of the frequency of appearance of the codes output from the converter to be tested.

In fact, an n-bit ADC has $2^n$ possible codes at its output.

When a test stimulus is applied to the input of the ADC 1, each code must appear a given number of times.

The principle of the histogram consists therefore of counting the number of times H(i) that each code i actually appears.

These frequencies of appearance H(i) are then used to determine the functional characteristics (shift, gain, non-linearities and others) of the converter.

Externally, in a conventional fashion, this type of test requires significant hardware resources.

This is because, in order to perform the testing of an n-bit ADC, it is necessary to use $2^{n+1}$ memory words for storing the histogram and a digital signal processor DSP or a microprocessor for using it.

The direct integration of this technique consequently represents an unacceptable solution since the surface area occupied by the memory and the microprocessor is much greater than that of the converter itself.

So as to make the integration of the test by the histogram economically viable, the technique has been defined so as to reduce the resources necessary for its functioning whilst keeping its performance.

The fundamental idea of the invention consists of decomposing, in time, the accumulation and exploitation of the histogram.

In fact, the histogram test considered as an algorithm can be decomposed in two dimensions: one temporal, the other spatial.

Under the constraint of a minimum surface area imposed for the integrated test module on the converter, the solution according to the invention consists of favoring the time decomposition of the algorithm.

The invention is therefore based on the code to code accumulation of the histogram and on a sequential processing of the information relating to each code.

For less strict surface area constraints, it is possible to calculate and exploit the histogram by groups of codes (2 codes by 2 codes . . . ).

At a given time in the sequential processing, the hardware resources required therefore relate only to the current code.

This is because, after processing a code, these resources are released and made available for the following code.

In addition, a second temporal decomposition consists of determining only one of the functional characteristics at a time.

The analysis is consequently decomposed into three phases.
1) Determination of the shift,
2) Determination of the gain,
3) Determination of the non-linearities.

When these three phases were applied, a triangular input stimulus was chosen, for minimising the calculation resources necessary to the exploitation of the histogram.

In the first phase, only the extreme codes are used to determine the shift.

$$\text{Shift} = k_1[p(2^n) - p(1)]$$

$k_1$ being a known constant.

In the second phase, only some of the codes of the middle are exploited sequentially in order to determine the gain.

$$\text{Gain} = k_2 \Sigma_{i=1}^{N} p(i+A)$$

$k_2$ being a known constant, and
A being a known constant depending on the number of bits of the converter.

In the third phase, each code is processed sequentially, and the differential non-linearity DNL(i) associated with each code i is thus obtained.

$$DNL(i) = k_3 p(i)$$

$k_3$ being a known constant.

In addition, the sequential cumulative total of DNL makes it possible to obtain the integral non-linearity INL(i) associated with each code i:

$$INL(i) = \sum_{j=i}^{i} DNL(j)$$

Finally, the amount of hardware resources necessary for applying the technique according to the invention is as follows.

The detection of the presence of an output code can be effected by means of a simple comparator and a counter for positioning the reference code.

The different processings involve only simple operations which can be set up by means of a counter/downcounter.

The three test phases are managed by a simple controller.

Figure 2:
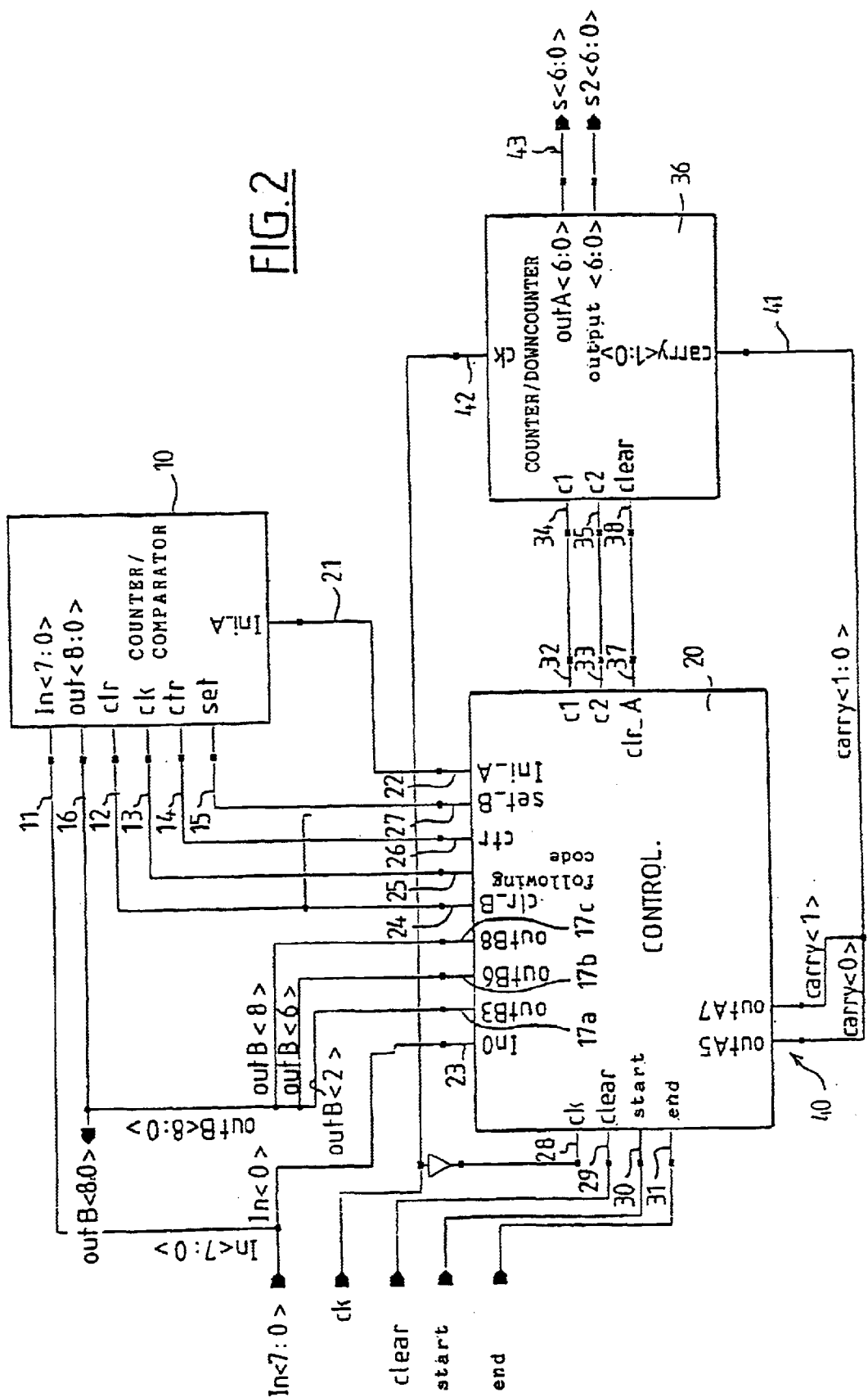
FIG. 2 is a more detailed block diagram of an embodiment of an analysis module according to the invention.

The outline diagram of a possible set up of a test module according to the invention is shown in FIG. 2.

This module, which is in fact the analysis module of the diagram in FIG. 1, has a counter/comparator 10 with n inputs 11 In<7:0> connected to the corresponding outputs of the ADC (not shown) and representing the 8-bit output code thereof.

It also has an erasure or zeroing input 12, a clock input 13, a control input 14 and an establishment input 15.

It also has outputs 16 connected to three inputs outB2, outB6, outB8, 17a, 17b, 17c of a controller 20 and an output 21 connected to an input 22 of the controller 20.

The controller 20 also has an input 23 connected to the outputs of the ADC, an erasure output 24 connected to the input 12 of the counter/comparator 10, a following code output 25 connected to the clock input 13, a control output 26 connected to the control input 14 of the circuit 10 and an establishment output 27 connected to the establishment input 15 of the counter/comparator 10.

The controller also has a clock input ck28, a clear erasure input 29, a start input 30 and an end input 31.

It also has an output C1 32 and an output C2 33, connected respectively to inputs C1, C2, 34, 35 of a counter/downcounter 36 and an erasure output 37 connected to an erasure input 38 of the counter/downcounter 36.

Finally, the controller 20 has a multiple input 40 by means of which it is connected to corresponding outputs 41 of the counter/downcounter 36.

The latter has a clock input 42 and a multiple output. 43 S<6:0>, which is the output of the flip-flops over 8 bits plus a carry output and represents the reference code.

Figure 3:
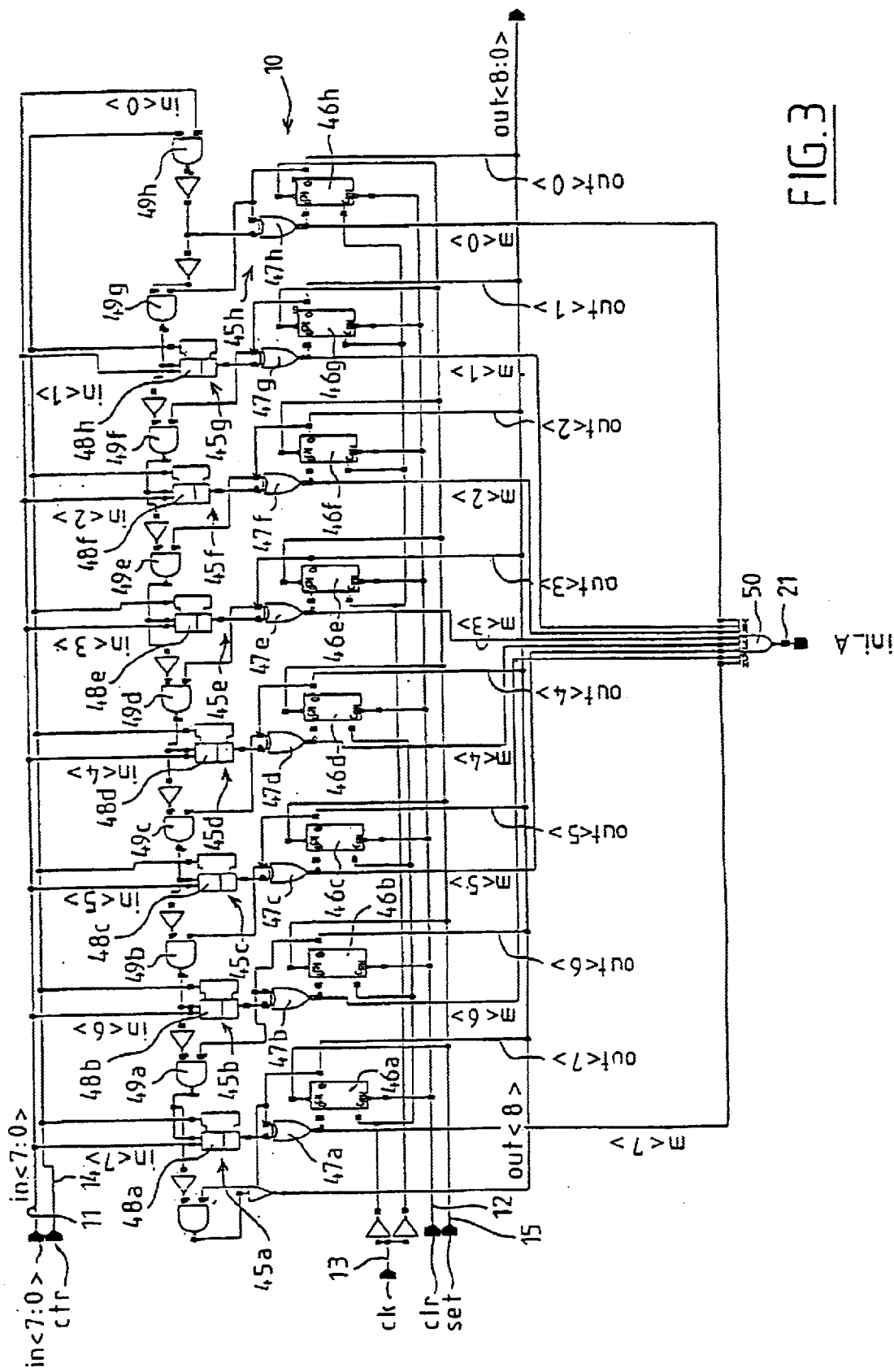
FIG. 3 is a more detailed representation of the counter of the diagram in FIG. 2.

The counter/comparator 10 is shown in detail in FIG. 3.

It is in the present example produced on the basis of an eight-bit counter, in which each of the eight stages has a set of gates 45a to 45h with which there is associated a flip-flop 46a to 46h. The counter or comparator functions of this circuit are determined by the signal coming from the control circuit 20 and applied to the control input 14+carry.

The comparison function is provided by an exclusive NOR gate 47a, an input of which is connected to the input 11 for receiving signals output from the analog to digital converter by means of a multiplexer 48a, another input of which is connected by means of a NAND gate 49a to the terminal Q of the flip-flop 46b of the following stage.

The output of each of the exclusive NOR gates 47a to 47h is connected to a corresponding input of a NAND gate 50.

The output of this gate constitutes the output 21 of the counter/comparator which delivers the signal Ini-A intended for the controller 20, and which gives the results of the comparison between the reference code and the output code of the ADC.

Figure 4:
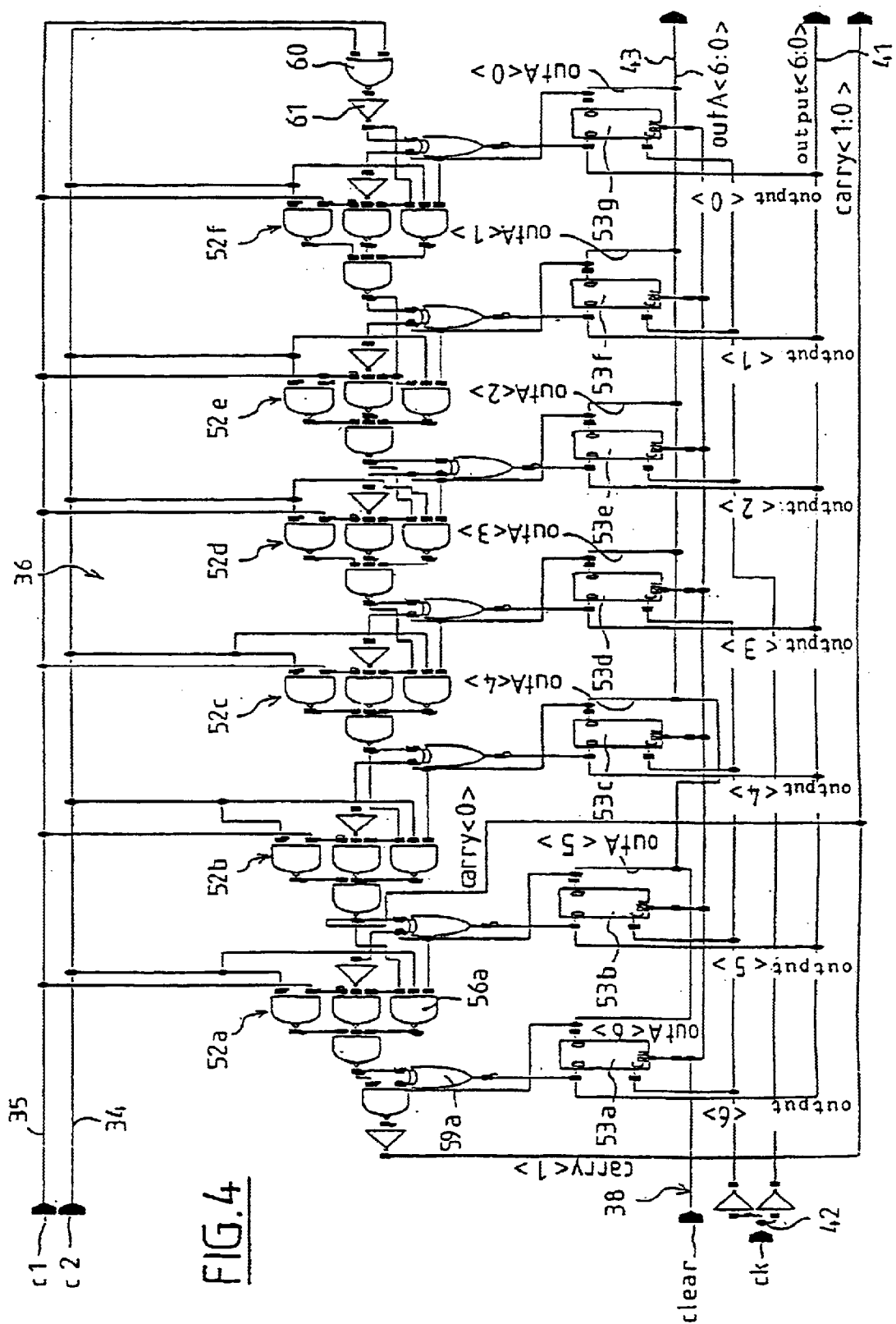
FIG. 4 is a more detailed representation of the counter/downcounter of the diagram in FIG. 2.

The counter/downcounter 36 of the circuit in FIG. 2 is shown in detail in FIG. 4.

It has six groups of gates 52a to 52f, with which corresponding flip-flops 53a to 53g are associated. 61 Each group of gates such as the group 52a has three NAND gates 54a, 55a, 56a.

The gate 54a has two inputs connected respectively to the inputs 34, 35 of the signals $C_2$ and $C_1$.

The gate 55a is a gate with three inputs, one of which is connected to the input 35 of the signal $C_2$, a second input of which is connected by means of an inverter 57a to an input of an exclusive OR gate in the following group of gates 52b, and a third input of which is connected to the output of a NAND gate in the group of gates 52b.

The third gate 56a is a three-input gate, a first input of which is connected to the output of the NAND gate in the group of gates 52b, a second input of which is connected to the input 34 of the signal $C_1$ and a third input of which is connected to the input of the exclusive OR gate in the following group of gates 52b.

The outputs of the gates 54a, 55a, 56a are connected to three respective inputs of a NAND gate 58a, the output of which is connected to an input of an exclusive OR gate 59a.

The output of the gate 59a is connected to the terminal D of the flip-flop 53 whilst the other input of the exclusive OR gate is connected to the terminal Q of the flip-flop 53a.

The terminal C of the said flip-flop is connected to the clock input ck 42, whilst its terminal RN is connected to the erasure terminal 38.

The other stages of the counter/downcounter are identical and will therefore not be described.

The signals $C_1$ and $C_2$ are also applied to a NOR gate whose output is connected by means of an inverter 61 to an input of an exclusive OR gate 62, the other input of which is connected to the terminal Q of an additional flip-flop 53g. The output of the gate 62 is connected to the terminal D of the flip-flop 53g connected to the output 41 of the circuit. The terminal Q of the flip-flop 53g is connected to the output 43, whilst its terminals C and RN are connected respectively to the clock and erasure inputs 42 and 38.

The technique presented makes it possible to determine the functional characteristics such as the shift, gain and non-linearities of an analog to digital converter.

This dynamic test is based on a statistical analysis of the frequency of appearance H(i) of each code i at the output of an n-bit ADC.

The whole of the test is effected with a triangular input at the maximum operating frequency of the converter.

For this type of signal, the theoretical frequency of appearance $H_{the}$ has the same value for all the codes $H_{the}=$ $$\frac{N}{2^n}.$$

It depends solely on the number N of samples and the number n of bits of the converter.

The determination of the shift and gain will now be described with reference to FIGS. 6 and 7.

The conventional definition of shift error is as follows. In an ADC, the shift error is the difference between the actual and theoretical voltages of the input which make the least significant bit switch.

Figure 6:
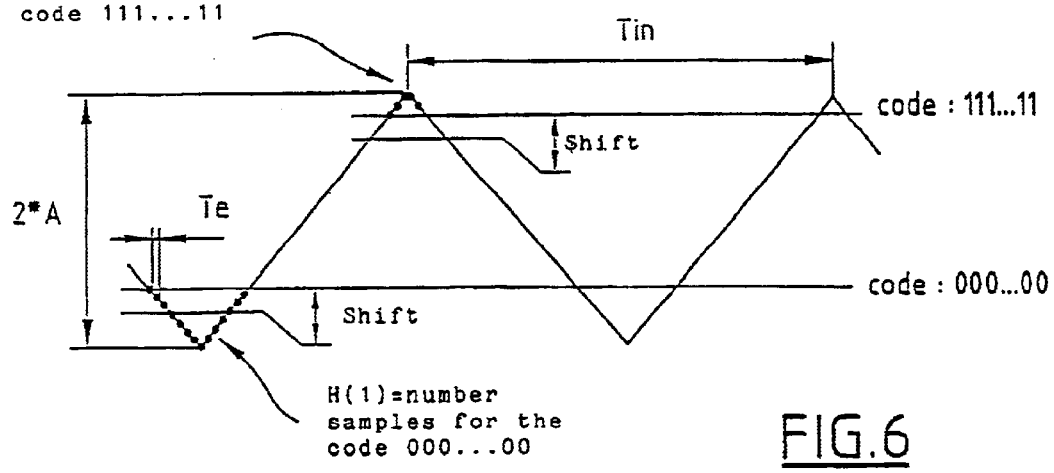
FIG. 6 is a diagram showing the determination of the shift.
Figure 7:
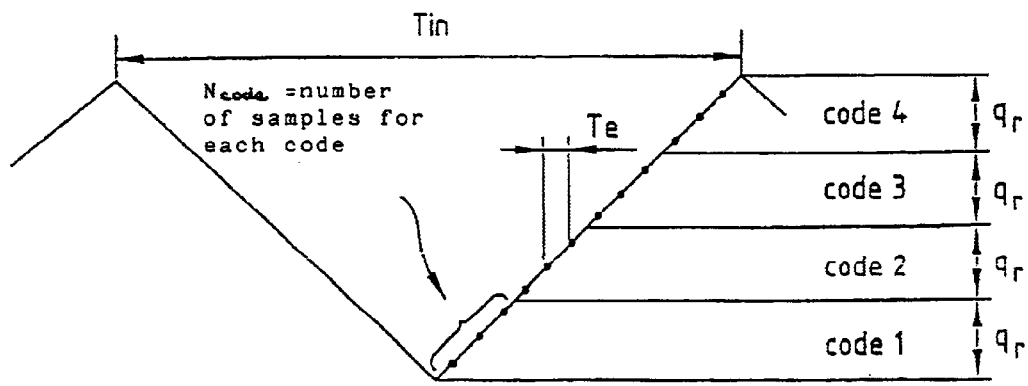
FIG. 7 is a diagram showing the determination of the gain.

According to the invention, the shift is calculated by means of two extreme codes, which are the only codes modified in the case of a shift error for a triangular signal such as the signal in FIG. 6.

The error here has a linear effect on the frequency of appearance of each code.

Consequently, a very simple expression of the shift expressed in terms of LSB is arrived at:

$$\text{Shift} = \frac{(H(2^n) - H(1)) \cdot A \cdot Te \cdot 2^n}{Tin \cdot PE} + C \qquad (1)$$

in which:

A is the amplitude of the input signal,

Te is the sampling period,

Tin is the period of the input signal,

PE is the full scale of the converter,

C is a known constant taking account of the shift in the ideal characteristic.

If for example it is wished to measure an error greater than 1 LSB, it is necessary to increase the amplitude of the input signal. This is because, if the amplitude of the input signal corresponds just to the full scale PE of the converter and if the shift is greater than 1 LSB, the code 00 . . . 00 would never be present at the output of the converter.

The minimum value of the input amplitude depends directly on the minimum shift measured.

$$A \leq \text{shift}_{max} + PE$$

A description will now be given of the determination of the gain with reference to FIG. 7, which shows the quantization step according to the number N of samples for each code.

If the converter has a gain g different from 1, its quantization step qr is always constant, but has a value g times smaller than in the ideal case qr=q/g.

For a study similar to that of the shift, qr can be obtained fairly easily:

$$qr = \frac{Ncode \cdot A \cdot fin}{fe} \qquad q = \frac{PE}{2^{n-1}}$$

The gain error expressed in terms of LSB can be determined by means of qr.

$$\text{Gain error} = \frac{qr - q}{q} = \frac{Ncode 2^{n-1} \cdot A \cdot Te - PE \cdot Tin}{\cdot PE \cdot Tin} \qquad (2)$$

In this equation, A, Te, Tin, PE and q represent respectively the amplitude of the input signal, the sampling period, the period of the input signal, the full scale voltage of the converter and the ideal quantization step.

This measurement cannot be carried out on only one code, since it is necessary to take account of the variations in the quantization step due to the non-linearities of the converter.

The least error in non-linearity on the code taken as a reference will be passed on to the measurement of the gain.

Consequently, the measurement will relate to several different codes. The variation in the quantization step for a code i is caused by the differential non-linearity of this code.

On the other hand, for a variation due to several codes, it is interesting to study the influence of the uncertainty on the integral non-linearity.

Take the extreme case where the variation in the quantization step due to the non-linearities of the codes studied is equal to the maximum acceptable integral non-linearity.

For a precision of measurement on the gain of $\Delta g$ and a maximum integral non-linearity error $INL_{max}$, the number of codes is equal to the ratio $INL_{max}$ to $\alpha g$.

$$\text{Number of codes} = \frac{INL_{max}}{\Delta g}$$

The precision of the measurement of the gain is very important for the rest since it has an influence on all future measurements.

For example, with fairly strict constraints:

$INL_{max}$–1.LSB and a good measuring precision, that is to say $\Delta g$=0.02 LSB.

It is necessary to calculate the mean of the gain error over 50 codes.

The determination of the non-linearities will now be described.

Two types of non-linearity can be defined:

differential non-linearities (DNL)

integral non-linearities.

Differential non-linearities represent the difference with respect to an LSB of the analog values corresponding to two successive codes.

In the present technique, they are determined directly from the frequency of appearance of the code to which they relate.

$$DNL(i) = \frac{H(i) - H_{the}}{H_{the}} \text{ with } H_{the} = \frac{N}{2^n} \qquad (3)$$

Integral non-linearities (INLs) represent the maximum difference between the actual characteristic and the ideal transfer straight line. They are calculated by accumulating the DNLs.

$$INL(i) = \sum_{j=i}^{i} DNL(j) \qquad (4)$$

The global algorithm of the technique according to the invention will now be described with reference to FIG. 5.

It should be noted that all the resources of the system can be reused after each initialization. Because of this, the overall resources necessary for applying the technique of the invention are small and therefore the structure can easily be integrated into an analog to digital converter.

Figure 5:
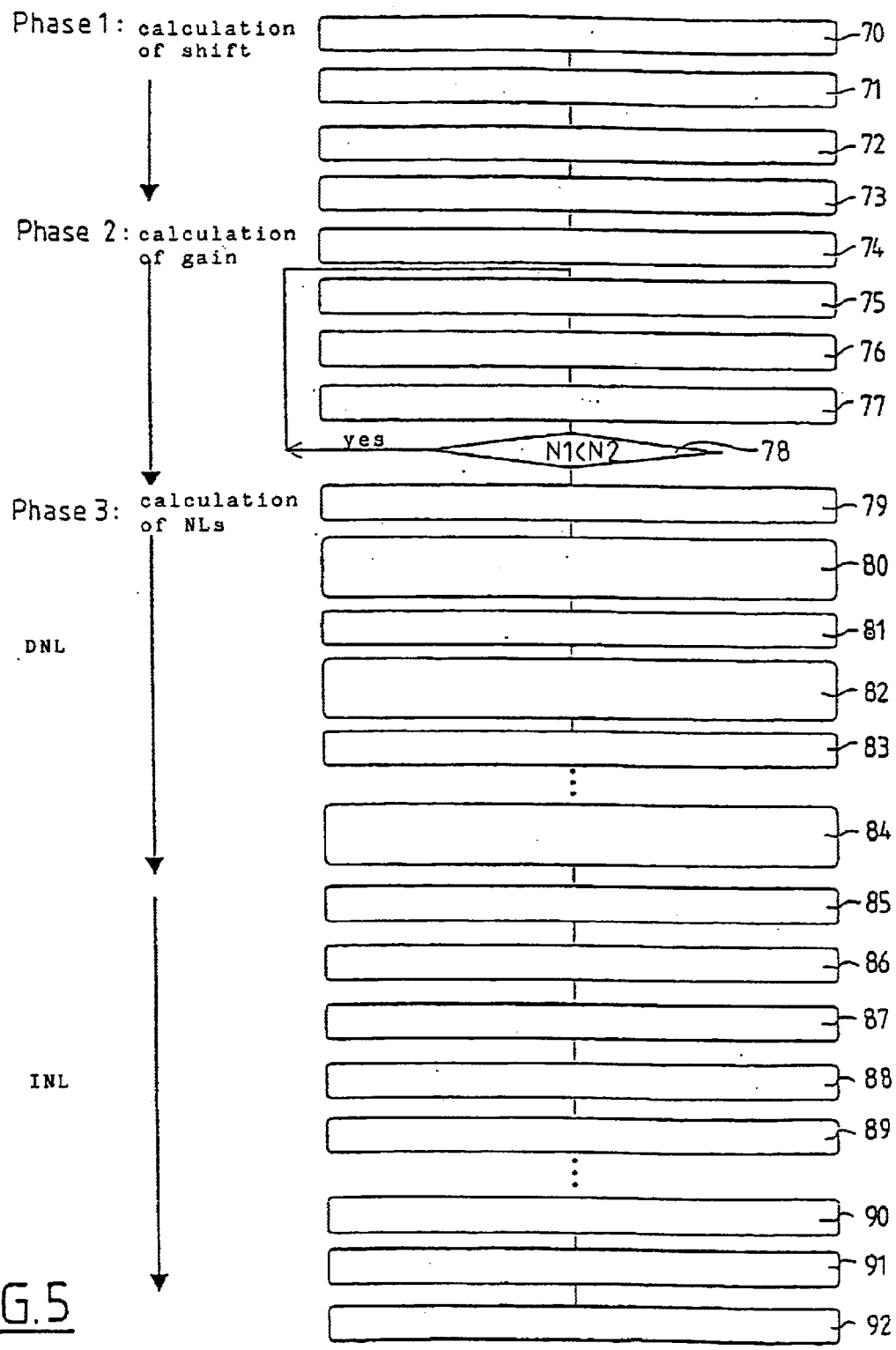
FIG. 5 is a detailed diagram of a flow diagram illustrating the calculation of the shift, gain and non-linearities by means of the module according to the invention.

The algorithm is depicted in FIG. 5 in the form of a flow diagram.

It includes:

a phase 1 of calculating the shift, a phase 2 of calculating the gain, a phase 3 of calculating the differential and integral non-linearities.

Phase 1 comprises a step 70 of initializing all the resources $H_{shift}=0$.

Then, during a step 71, the frequency of appearance H(o) of the code 0 is calculated.

During the phase 72, the frequency of appearance $H(2^n)$ of the code $2^n$ is calculated.

During the step 73, $H_{shift}=H(2^n)-H(0)$ is calculated.

These operations are performed with the resources described with reference to FIGS. 2 to 4 programmed to provide the calculation of the shift.

During the step 74, the resources are initialized with a view to the phase 2 of calculating the gain. At the end of this initialization $H_{gain}=0$.

Then, during step 75, the frequency of appearance H(N1) of the code N1 is calculated.

During the step 76, accumulation is effected with the previous gain value, $H_{gain}=H_{gain}+H(N1)$.

During the step 77, the reference code N1 is incremented:

$N1=N1+1.$

During the step 78, it is determined whether N1<N2.

In the affirmative, the step 75 of calculating the frequency of appearance H(N1) of the code N1 is returned to.

In the negative, the step 79 of initializing the resources $H_{DNL}=0$ is passed to with a view to passing to the phase 3 of calculating the non-linearities.

During step 80, the frequency of appearance H(2) of the code 2 is calculated, $H_{DNL}(2)=H(2)$.

During step 81, all the resources $H_{DNL}=0$ are initialized.

During step 82, the frequency of appearance H(3) of the code 3 is calculated, $H_{DNL}(3)=H(3)$.

During step 83, all the resources are initialized again with a view to calculating the frequency of appearance of the code i, and then these operations are recommenced until calculation during the step 84 of the frequency of appearance $H(2^n-1)$ of the code $2^n-1.H_{DNL}(2^n-1)=H(2^n-1)$.

During the step 85, all the resources are initialized with a view to calculating the integral non-linearities.

Then, during the step 86, the frequency of appearance H(2) of the code 2 is calculated.

During the step 87, the accumulation is carried out with the previous value $H_{INL}=H_{INL}+H(2)$ During step 88, the frequency of appearance H(3) of the code 3 is calculated.

During the step 89, the accumulation is carried out with the previous value $H_{INL}=H_{INL}+H(3)$ and so on until the frequency of appearance $H(2^n-1)$ of the code $2^n-1$ is calculated during the step 90.

During the step 91, the accumulation is carried out with the previous value, resulting in the obtaining of the integral non-linearity $H_{INL}=H_{INL}+(2^n-1)$.

Finally, at step 92, all the resources are initialized with a view to the following series of calculations.

A practical example embodiment is given below of an analog to digital converter with an integral self-test module:

8-bit analog to digital converter (256 codes), sampling frequency 10 MHz, frequency of input signal 1.22 MHz, 8192 samples per test frame. Therefore 1000 periods of the input signal for each frame, acceptable shift error±1.5 LSB, acceptable gain error±1.5 LSB, acceptable differential non-linearities±0.5 LSB, acceptable integral non-linearities±0.5 LSB.

The hardware resources necessary for implementing the invention are shown in FIG. 2.

They include a unit for detecting the presence of a code at the output of the analog to digital converter.

This unit, shown at 10 in FIG. 2, is, as indicated above, a counter/comparator for positioning the reference code.

a histogram exploitation unit 36, produced in the form of a ones complement counter/downcounter, a unit 20 for managing the three test phases or controller.

The two units 36 and 10 can be grouped together in the same unit.

The implementation of this technique is described with reference to FIGS. 3 and 4. It is advantageously implemented in AMS0.8 µm technology.

The construction and functioning of each unit will now be described.

The counter/comparator unit 10 makes it possible to position, in the counter, the reference code which it is wished to process and to compare it with the output code of the converter.

It consists of 8 flip-flops 46a to 46h with setting to one and setting to zero connected by the combinatory logic described with reference to FIG. 3.

This unit has two functions: placing the reference code and comparing it with the output code of the converter.

The placing of the reference code is effected by incrementing the output of the unit functioning in counter mode and the comparison in comparator mode takes place reusing the exclusive OR gates 47a to 47h of the counter.

The control input 12 is necessary for changing from one mode to the other.

If the control input 12 receives a signal crt=0, the unit is placed in counter mode and the output is incremented at each clock edge.

If the control input 12 receives a signal ctr=1, the unit makes the comparison between the reference code, out<7:0> and the output code of the converter $l_1$<7:0>.

If the two codes are equal, Ini-A goes to zero.

If the two codes are different, Ini-A goes to one.

The processing unit depicted in FIG. 4 makes it possible to perform all the operations necessary for the exploitation of the histogram. As depicted in FIG. 4, it consists of seven flip-flops 53a to 53f and 63 with setting to zero and a combinatory logic between these different flip-flops.

The output 41 is an eight-bit output which represents the various characteristics.

The output 43 is the output of the last flip-flop 53g and forms an input of the controller.

To calculate the shift, the processing unit must make the subtraction between the frequency of appearance of the two extreme codes and must store the result.

This operation is performed by configuring the processing unit as a 7-bit counter/downcounter. For calculating the other characteristics, the processing block has only a function of accumulator and therefore remains in counter configuration.

The result contained in the processing unit represents the difference between the theoretical value and the actual value of the frequency of appearance $H(i)-H_{the}$.

To be able to use the results, it is necessary to take account of the sign of this difference.

If the value stored in the unit 36 is negative, the output is complemented to 1.

The two control inputs C1, C2, 34, 35 are used to configure the processing unit.

There are four operating modes:
1) Transparency mode: the output S is equal to the output of the flip-flops 53a–53f (C1=C2=1).
2) Complement mode: the output S is equal to the ones complement of the output of the flip-flops (C1=C2=0).
3) Counter mode: the output is incremented at each clock edge (C1=1; C2=0).
4) Downcounter mode: the output is decremented at each clock edge (C1=0; C2=1).

The controller 20 makes it possible to manage all the test phases.

The inputs receive the following signals:

Ini-A 22 gives the result of the comparison between the output code of the ADC and the reference code.

InO 23 receives the least significant bit of the output code of the converter.

The input 28 is the input of the clock signal ck of the controller.

The inputs 17a, 17b, 17c receive outB2, outB6 and outB8, which are respectively the bits 3, 7 and the carry of the counter/comparator unit 10.

The inputs outA5 and outA7 40 represent the carry bits 0 and 1 of the output 41 of the processing unit 36.

The start and end inputs 30, 31 are connected to a stimulus generator (not shown) and indicate when the output codes of the converter can be used. The erasure or clear input allows initialization of the controller.

The outputs 32, 33 and 37 deliver control bits C1, C2 and clr-A to the processing unit 36.

The output 25 is connected to the clock of the counter/comparator unit 10 in order to deliver a following code signal to it.

The outputs 24, 26, 27 deliver control bits ctr, clr-B and set-B to the counter/comparator 10.

Figure 8:
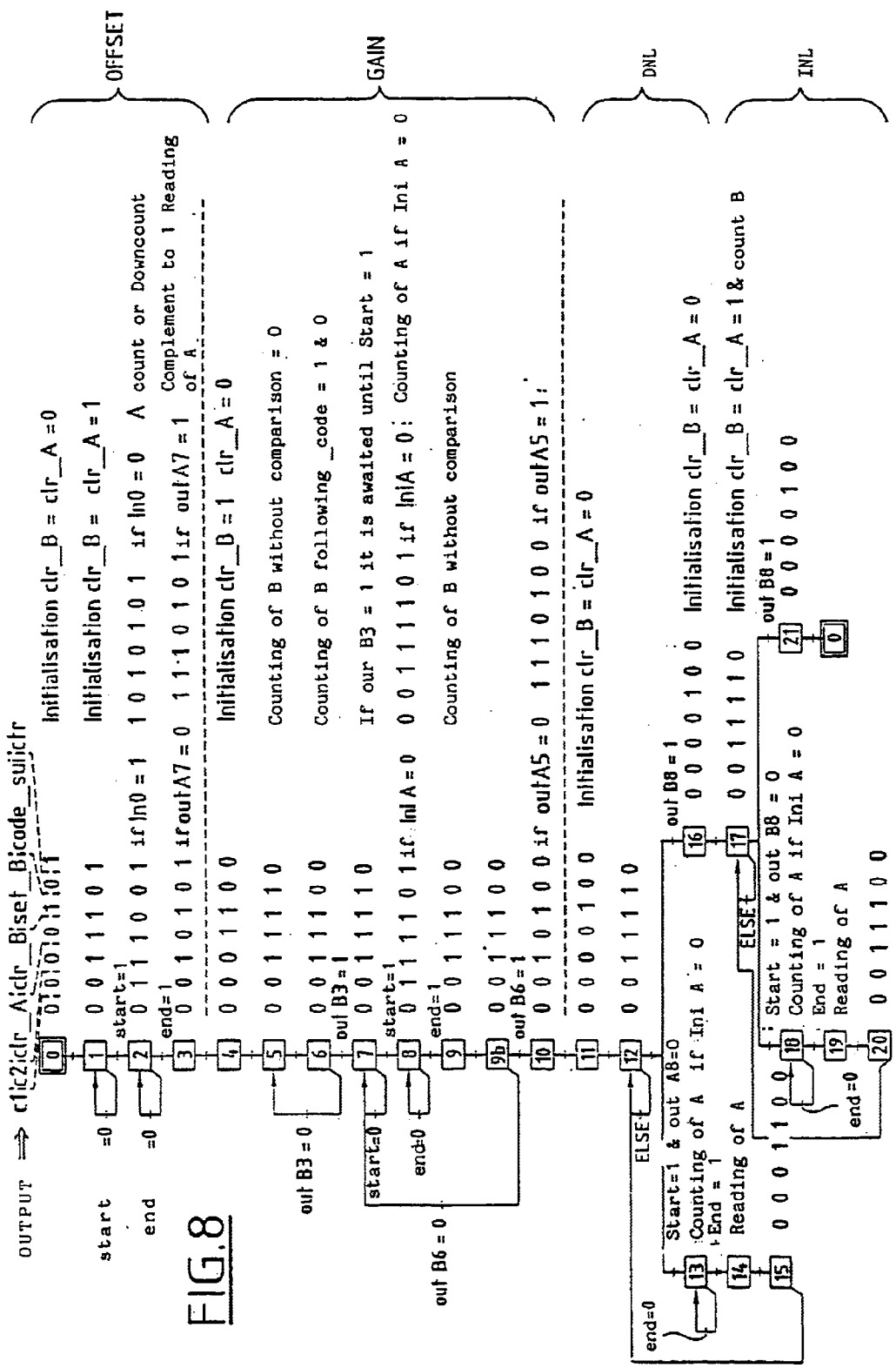
FIG. 8 depicts an algorithm for testing the essential parameters of the converter.

The general functioning of the comparator is detailed in the algorithm shown in FIG. 8.

Throughout all the test phases described below, it is considered that the stimulus generator supplies two binary signals Start and End in addition to the triangular signal.

These signals designate the start and end of each test frame.

The number of periods P of the input signal included in the frame depends on the frequency of the input signal $E_{nd}$, the sampling frequency $f_e$ and the sample number to be processed N.

$$P = \frac{fe * N}{End}$$

It is necessary to manage as many frames as there are codes to be processed during the various phases.

1) Shift Determination Phases

Figure 9:
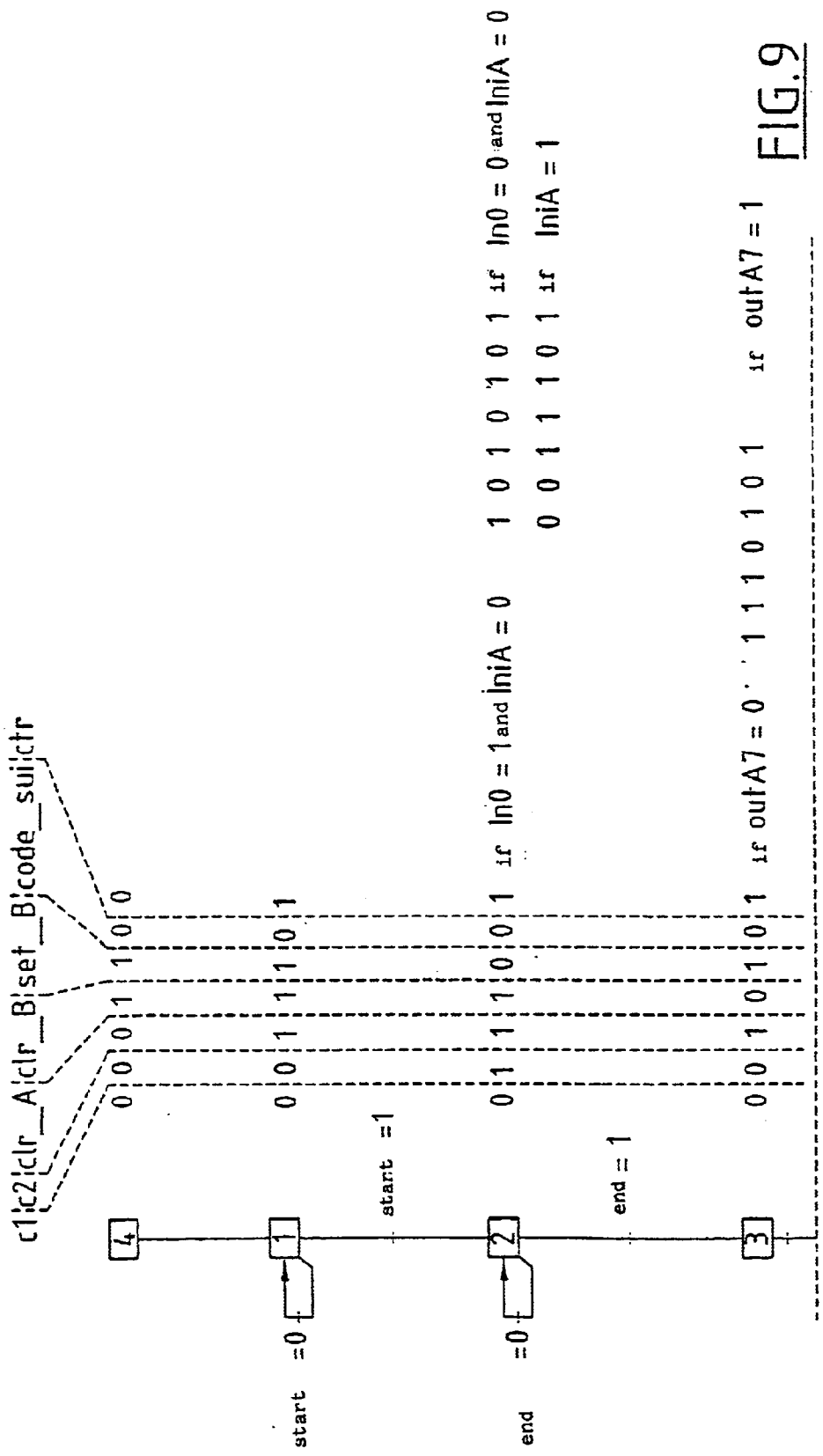
FIG. 9 depicts an algorithm for calculating the shift.

In this phase, for which the calculation algorithm is depicted in FIG. 9, the counter of the counter/comparator 10 has to have in its output only two values 00 . . . 00 or 11 . . . 11.

Consequently, the controller controls only the input of the counter for setting to zero and to one.

The processing unit 36 is configured as a downcounter if the output code is the code 00000000 and as a counter if the output code is 11111111.

Because of this, the unit 35 makes the subtraction between the frequency of appearance of the two extreme codes.

This difference is proportional to the shift, as can be seen according to equation (1).

During this phase, the processing of the two extreme codes takes place simultaneously and therefore requires only one test frame.

It can be seen in the calculation algorithm of FIG. 9 that the bits C1, C2, clr-A, clr-B, set-B, code-sui and ctr have respectively the values 100010 and 1.

The initialization of all the units is provided by:
the setting to zero of the processing unit 36 (clr-A=0)
the setting to zero of the counter/comparator 10 B(clr-B= 0).

The aforementioned bits then go to the following states:

| C1 | C2 | clr-A | clr-B | set-B | fol-code | ctr |
|----|----|-------|-------|-------|----------|-----|
| 0  | 0  | 1     | 1     | 1     | 0        | 1   |

The controller then awaits the signal (start) coming from the stimulus generator in order to commence the calculation of the shift.

The start signal goes to 1 and the calculation of the shift takes place. It continues as long as the signal End=0.

This calculation is provided by the positioning of the counter of the counter/comparator 10 to the code 0 or 1 (clr-B/set-B) depending on whether InO is equal to 0 or 1.

Next there is a comparison between the output of the counter and the output code of the ADC (In).

Next there is incrementation or decrementation of the counter 36 depending on the result and the value of Ino and the result of the comparison (value of Ini-A).

At the end of the calculation of the shift, the aforementioned bits have the following values:

|                      | C1 | C2 | clr-A | clr-B | set-B | fol-code | ctr |
|----------------------|----|----|-------|-------|-------|----------|-----|
| Ini- A=0 and InO = 1 | 0  | 1  | 1     | 1     | 0     | 0        | 1   |
| Ini- A=0 and InO=0   | 1  | 0  | 1     | 0     | 1     | 0        | 1   |
| Ini- A=1             | 0  | 0  | 1     | 1     | 1     | 0        | 1   |

The result is read in the processing unit or counter/downcounter 36 and the complement of the result is taken or not depending on the carry value 0.

The aforementioned bits are then the following respective values:

|          | C1 | C2 | clr-A | clr-B | set-B | fol-code | ctr |
|----------|----|----|-------|-------|-------|----------|-----|
| outA7=0  | 0  | 0  | 1     | 0     | 1     | 0        | 1   |
| outA7=1  | 1  | 1  | 1     | 0     | 1     | 0        | 1   |

2) Gain Determination Phase

Figure 10:
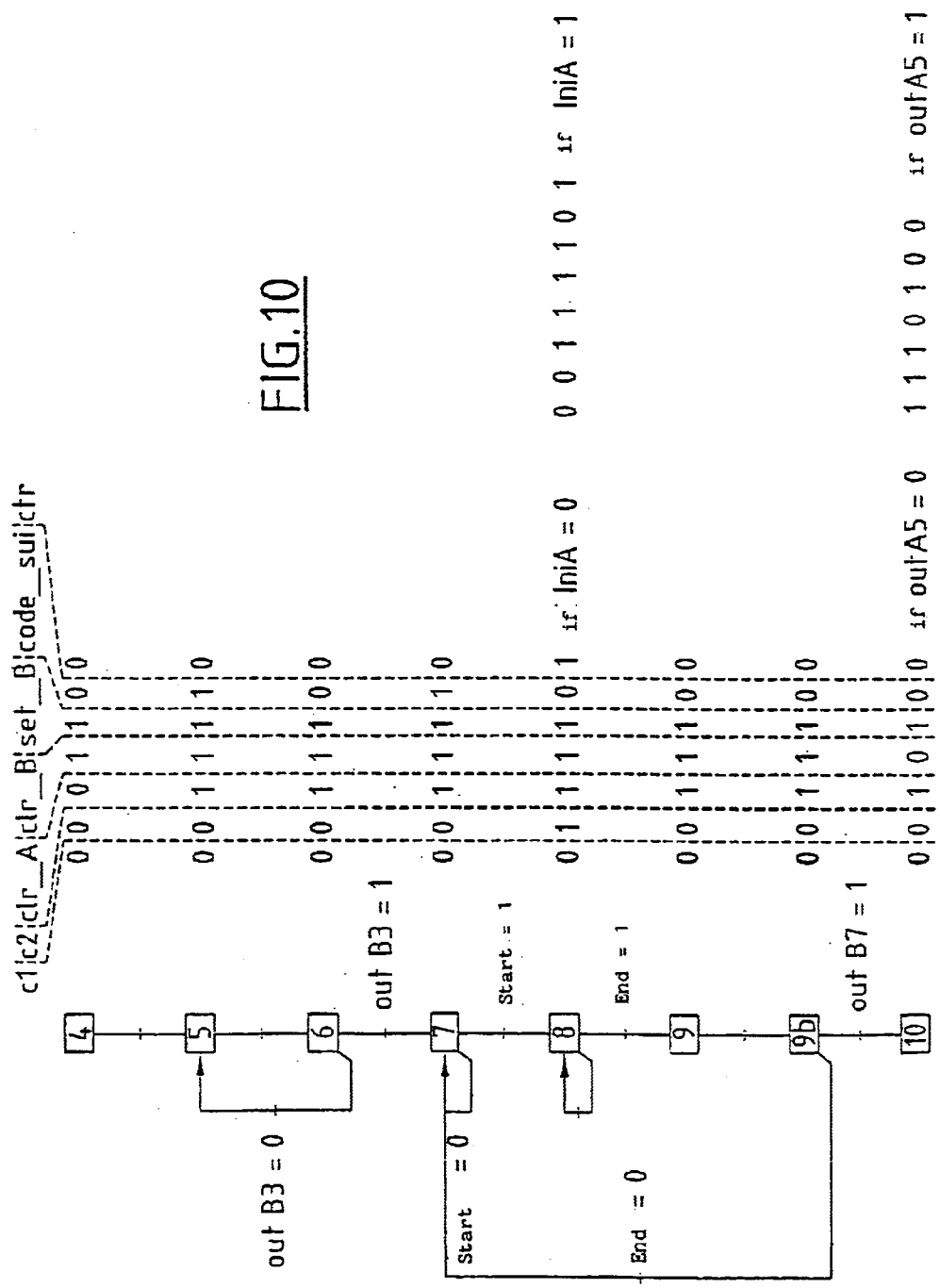
FIG. 10 depicts an algorithm for calculating the gain.

The gain determination phase will be described with reference to the gain calculation algorithm shown in FIG. 10.

The gain is calculated by means of the middle codes. It is necessary to process a fairly large number of codes in order to obtain a good measurement precision.

To this end, for example, the frequency of appearance of 61 codes distributed between the third and the sixty-fourth are totalled.

The first step will be to place the first reference code in the counter of the counter/comparator 10 (code 00000100).

The frequency of appearance of this code is calculated.

Next the counter is incremented (code 00000101) and the value of the frequency of appearance is added to the previous one.

This operation is repeated until the last code to be processed (code 01000000). The result can then be extracted from the processing unit 36.

For each code, the generator must supply a complete test frame.

For the example dealt with here, the measurement of the gain requires 61 frames.

The operations are as follows.

During initialization, the bits C1, C2, clr-A, clr-B, set-B, code-sui, crt, initially have the respective values 0001100.

The counter/downcounter 36 and the counter/comparator 10 are then initialized.

Then the aforementioned bits go to the following respective values.

| C1 | C2 | clr-A | clr-B | set-B | fol-code | ctr |
|----|----|-------|-------|-------|----------|-----|
| 0  | 0  | 1     | 1     | 1     | 1        | 0   |

The reference code is placed on the counter of the counter/comparator 10, and then this counter is incremented until the code 00000100=first code processed in order to determine the gain, this incrementation taking place as long as outB2=0.

When outB2=0, the aforementioned bits take the values 0011110.

The system is on standby: the controller 20 is awaiting the signal (start) coming from the stimulus generator in order to commence the calculation of the gain.

The start signal goes to Start=1.

The aforementioned bits then go to the following values:

|        | C1 | C2 | clr-A | clr-B | set-B | fol-code | ctr |
|--------|----|----|-------|-------|-------|----------|-----|
| IniA=0 | 1  | 0  | 1     | 1     | 1     | 0        | 1   |
| IniA=1 | 0  | 0  | 1     | 1     | 1     | 1        | 0   |

There is calculation of the gain as long as the signal End=0.

There is a comparison between the output of the counter of the counter/comparator 10 and the output code of the ADC (In).

Depending on the result of this comparison, there is incrementation of the counter/downcounter 36.

The aforementioned bits then go to the following values 0011100.

The counter of the counter/comparator 10 is then incremented if the reference code is not equal to the last code to be processed (01000000) in order to determine the gain and the process is recommenced without initializing the counter/downcounter.

When the signal outB6=1, the aforementioned bits go to the following values:

|        | C1 | C2 | clr-A | clr-B | set-B | fol-code | ctr |
|--------|----|----|-------|-------|-------|----------|-----|
| outA5=0 | 0  | 0  | 1     | 0     | 1     | 0        | 0   |
| outA5=1 | 1  | 1  | 1     | 0     | 1     | 0        | 0   |

The result is read in the processing unit 36 and the complement of the result is taken or not depending on the value of outA5.

The phase of determining the non-linearities will now be described.

3) Phase of Determining the Non-linearities

Figure 11:
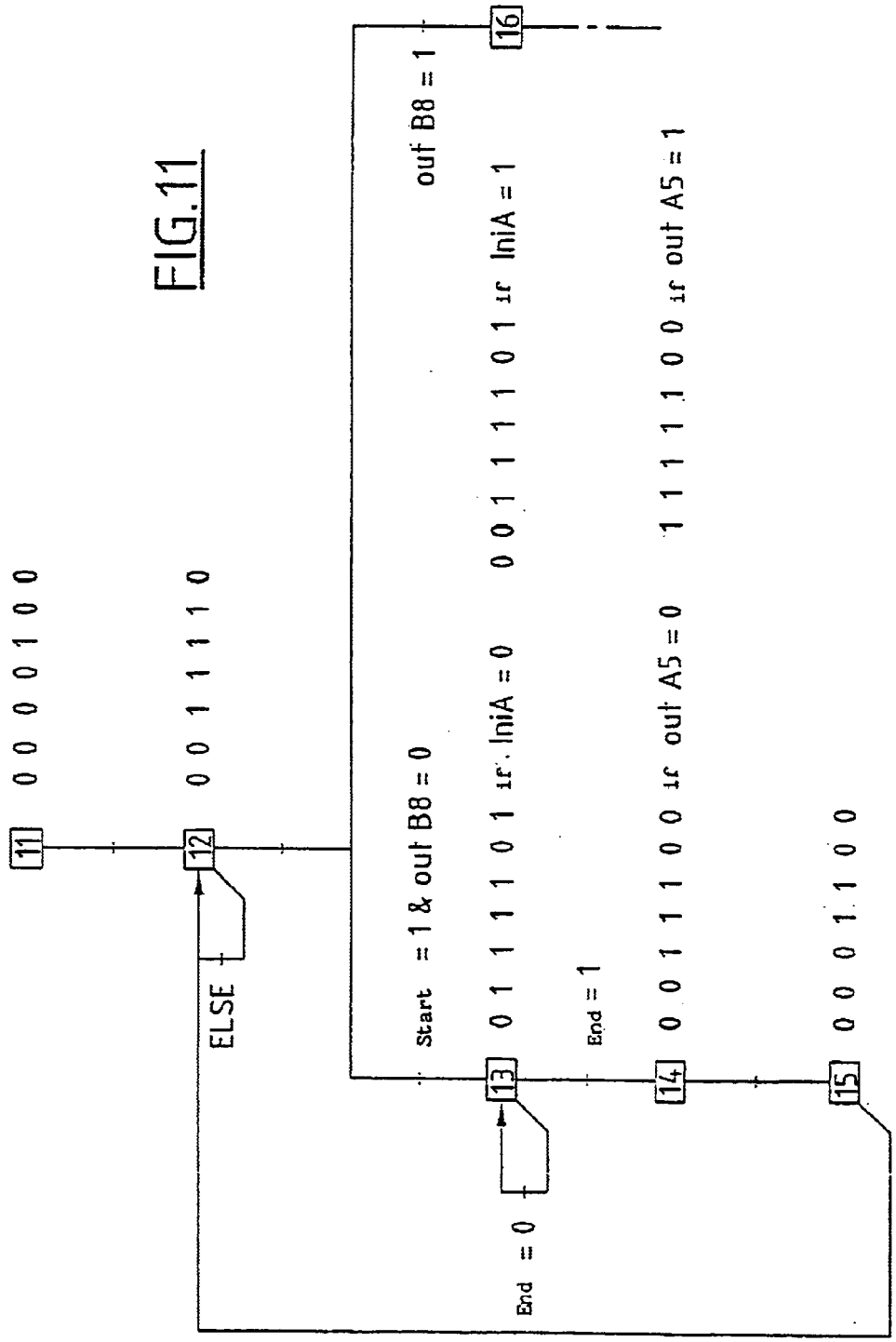
FIG. 11 depicts an algorithm for calculating the differential non-linearities.

The differential non-linearities are commenced with. The phase of determining the differential non-linearities will be described with reference to the DNL calculation algorithm shown in FIG. 11.

The first code to be processed is positioned at the output of the counter/comparator 10.

The frequency of appearance of this code is calculated in the counter/downcounter 36. Next the counter/downcounter 36 is initialized and the counter of the counter/comparator 10 is incremented in order to place the following code and so on.

A complete frame (Pperiods) of the input signal is necessary for each code (sequential processing).

At the time of initialization, the bits C1, C2, clr-A, clr-B, set-B, code-sui, ctr, respectively have the following values: 0000100.

There is initialization of the circuits 36 and 10. 213 Then the aforementioned bits go to the following values 0011110. The controller 20 awaits the signal "start" coming from the stimulus generator (not shown) in order to commence the calculation of the non-linearities.

When the signals start=1 and outB8=0, the aforementioned bits take the following values:

|        | C1 | C2 | clr-A | clr-B | set-B | fol-code | ctr |
|--------|----|----|-------|-------|-------|----------|-----|
| IniA=0 | 1  | 0  | 1     | 1     | 1     | 0        | 1   |
| IniA=1 | 0  | 0  | 1     | 1     | 1     | 0        | 1   |

As long as End=0, there is calculation of the non-linearities.

There is a comparison between the output of the circuit 10 and the output code of the ADC (In), then incrementation or not of the circuit 36 according to the result.

When End=1, the aforementioned bits then go to the following values:

|        | C1 | C2 | clr-A | clr-B | set-B | fol-code | ctr |
|--------|----|----|-------|-------|-------|----------|-----|
| outA5=0 | 0  | 0  | 1     | 1     | 1     | 0        | 0   |
| outA5=1 | 1  | 1  | 1     | 1     | 1     | 0        | 0   |

Then there is a reading of the result in the circuit 36 and complementing or not of this result depending on the value of outA5.

Finally, the aforementioned bits take the following values 0001100.

The counter of the counter/comparator 10 is then incremented and the counter/downcounter circuit 36 is initialized (ctr-A=0).

The integral non-linearities INL are determined as follows with reference to the calculation algorithm shown in FIG. 12.

The same operation as for the determination of the differential non-linearities is repeated, but without initializing the counter/downcounter 36 before each frame.

Figure 12:
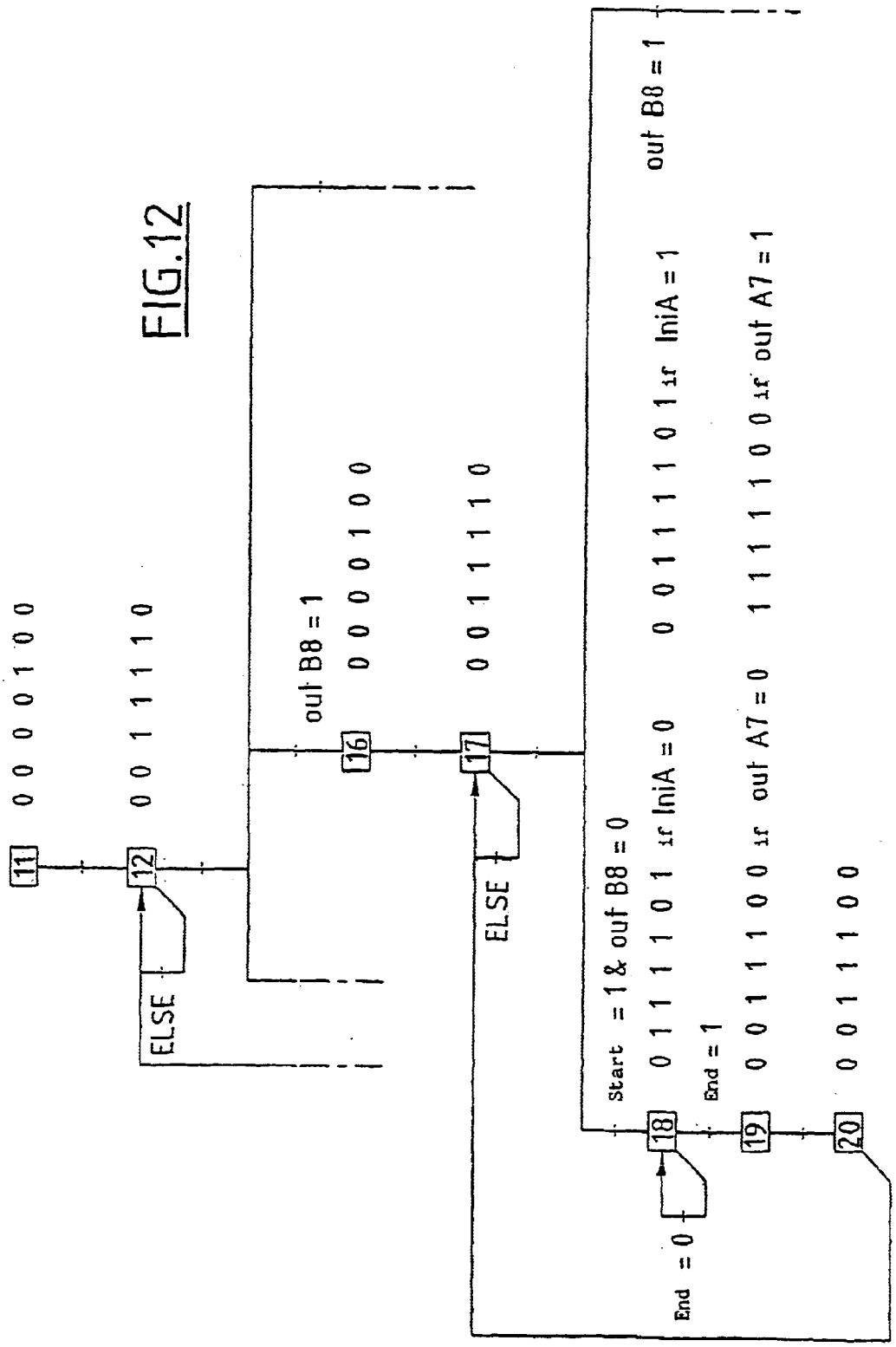
FIG. 12 depicts an algorithm for calculating the integral non-linearities.

It can be seen in the algorithm in FIG. 12 that, on initialization of the device, the aforementioned bits have the following values: 0000100.

There is initialization of the units 36 and 10 (FIG. 2).

Next these bits go respectively to the following values 0011110.

The controller 20 awaits the signal "start" coming from the stimulus generator in order to commence the calculation of the non-linearities.

If outB8=1, the aforementioned bits go to the values: 0000100. The units 36 and 10 are initialized.

If outB8=0, the controller 20 awaits the signal "start" coming from the stimulus generator in order to commence the calculation of the integral non-linearities.

On the appearance of the signals Start=1 and outB8=0, the aforementioned bits take the following values:

|        | C1 | C2 | clr-A | clr-B | set-B | fol-code | ctr |
|--------|----|----|-------|-------|-------|----------|-----|
| In1A=0 | 0  | 1  | 1     | 1     | 1     | 0        | 1   |
| IniA=1 | 0  | 0  | 1     | 1     | 1     | 1        | 0   |

The calculation of the integral non-linearities takes place as long as End=0.

When End=1, the output of the circuit 10 is compared with the output code of the ADC (In) and the circuit 36 is incremented or not according to the result.

The aforementioned bits then have the following values:

|        | C1 | C2 | clr-A | clr-B | set-B | fol-code | ctr |
|--------|----|----|-------|-------|-------|----------|-----|
| outA7=0 | 0  | 0  | 1     | 1     | 1     | 0        | 0   |
| outA7=1 | 1  | 1  | 1     | 1     | 1     | 0        | 0   |

The result is then read in the processing unit or counter/downcounter 36 and is complemented or not according to the value of outa5.

The bits go to the values: 0011100.

finally, the counter of the counter/comparator 10 is incremented.

What is claimed is:

1. A method of testing an analog to digital converter by histogram, the method being carried out on common resources integrated with the digital converter, wherein the method consists of:

accumulating the histogram code by code or group of codes by group of codes; and sequentially processing information relating to each code or group of codes in order to determine at least a functional characteristic of the converter, wherein after processing of a code or group of codes, the common resources are released and made available for a following code or group of codes, so that at a given time in the processing, the common resources relate only to a current code or group of codes simultaneously processed.

2. A method according to claim 1, wherein the method consists of processing only one functional characteristic of the analog to digital converter at a time and wherein the method of testing consist of successively initializing and configuring said common resources to adapt said resources to a determination of each functional characteristic of said converter.

3. A method according to claim 2, wherein the functional characteristics of the converter are shift, gain and non-linearities.

4. A method according to claim 3, wherein the shift is determined by sampling a triangular signal applied to the converter and by calculating from two extreme codes resulting from the sampling of the said triangular signal which are the only codes modified in the case of a shift error, using the equation:

$$\text{Shift} = \frac{(H(2^n) - H(1)) \cdot A \cdot Te \cdot 2^n}{Tin \cdot PE} + C$$

in which:

A is the amplitude of the input signal,

C is a known constant taking account of the shift in the ideal characteristic,

Te is the sampling period,

Tin is the period of the input signal, $H(2^n)$ is the number of samples for the code 111 ... 11, H(1) is the number of samples for the code 000 ... 00, PE is the full scale of the converter.

5. A method according to claim 3, wherein the gain is determined by sampling a triangular signal applied to the converter and forming successive codes each comprising a number of samples of said signal and defining a quantization step qr and calculating the gain error by means of the equation:

$$\text{Gain error} = \frac{qr - q}{q} = \frac{Ncode2^{n-1} \cdot A \cdot Te - PE \cdot Tin}{PE \cdot Tin}$$

in which A, Te, Tin and PE represent respectively the amplitude of the input signal, the sampling period, the period of the input signal and the reference voltage of the converter.

6. A method according to claim 3, wherein the non-linearities are differential non-linearities and integral non-linearities.

7. A method according to claim 3, wherein the determination of the differential non-linearities representing the difference with respect to the least significant bit LSB of the analog values corresponding to two successive codes, is provided by means of the equation:

$$DNL(i) = \frac{H(i) - H_{the}}{H_{the}} \text{ with } H_{the} = \frac{N}{2^n}$$

H(i) being the frequency of appearance of each code i at the output of the analog to digital converter.

8. A method according to claim 3, wherein the determination of the integral non-linearities representing the difference with respect to the least significant bit LSB between the actual characteristic and the ideal straight line is provided by the following equation:

$$INL(i) = \Sigma_{j=i}^{i} DNL(j)$$

the integral non-linearities being calculated by accumulation of the differential non-linearities.

9. A self-test device for an analog to digital converter for implementing a method of testing the analog to digital converter by histogram, by accumulating the histogram code by code or group of codes by group of codes, and sequentially processing information relating to each code or group of codes in order to determine at least a functional characteristic of the converter, the self-test device comprising:

means of applying test signals to the converter; and analysis means, wherein, said analysis means include integrated and configurable common resources for accumulating the histogram code by code or group of codes by group of codes, and sequentially processing information relating to each code or group of codes and means for configuring said common resources to, after processing of a code or group of codes, release and make available the common resources for the following code or group of codes, so that at a given time in the processing, the common resources relate only to the current code or group of codes simultaneously processed.

10. A device according to claim 9, wherein said configurable common resources are designed for successively determining functional characteristics of the converter and said means of configuring are designed to adapt the common resources to the characteristic to be determined.

11. A device according to claim 10, wherein said analysis means include a reference code counter/comparator connected to the output of the analog to digital converter, a use and storage counter/downcounter whose output delivers signals relating to the functional characteristics of the converter and a controller for the management of the test phases by said counter/comparator and said counter/downcounter.

12. A device according to claim 11, wherein said reference code counter/comparator and the counter/downcounter are joined in the same unit.

13. A device according to claim 11, wherein said counter/comparator comprises a plural stage eight-bit counter, each stages having a set of gates with which a flip flop is associated and a comparator comprising, for each stage, an exclusive NOR gate, an input of which is connected to an input for receiving the output signals from the analog to digital converter by means of a multiplexer, another input of which is connected by means of a NAND gate to a terminal Q of the flip-flop of the following stage.

14. A device according to claim 10, wherein the counter/downcounter has groups of gates, with which groups of gates there are associated corresponding flip-flops and inputs for signals for configuring the counter/downcounter as a counter or as a downcounter, respectively, by said controller for the management of the test phases.

15. An analog to digital converter, comprising an integrated self-test device for implementing a method of testing the analog to digital converter by histogram, by accumulating the histogram code by code or group of codes by group of codes, and sequentially processing information relating to each code or group of codes in order to determine at least a functional characteristic of the converter, the self-test device comprising:

means of applying test signals to the converter; and analysis means, wherein, said analysis means include integrated and configurable common resources for accumulating the histogram code by code or group of codes by group of codes, and sequentially processing information relating to each code or group of codes, and means of configuring said common resources to, after processing of a code or group of codes, release and make available the common resources for the following code or group of codes, so that at a given time in the processing, the common resources relate only to the current code or group of codes simultaneously processed.

* * * * *

UNITED STATES PATENT AND TRADEMARK OFFICE
CERTIFICATE OF CORRECTION

PATENT NO. : 6,642,870 B1
DATED : November 4, 2003
INVENTOR(S) : Michel Renovell et al.

It is certified that error appears in the above-identified patent and that said Letters Patent is hereby corrected as shown below:

<u>Title page,</u>
Below item [87], insert as follows:
-- [30]   Foreign Application Priority Data
  Sept. 09, 1999   (FR) ……………………….. 99/11304 --.

Signed and Sealed this

Tenth Day of February, 2004

JON W. DUDAS
*Acting Director of the United States Patent and Trademark Office*